US012810053B1

(12) United States Patent
Roesch et al.

(10) Patent No.: US 12,810,053 B1
(45) Date of Patent: Nov. 24, 2026

(54) SYSTEM AND METHOD FOR ADDRESSING CUSTOM PASSIVE DEVICES ASSOCIATED WITH THE PHYSICAL VERIFICATION OF AN ELECTRONIC CIRCUIT DESIGN

(71) Applicant: Cadence Design Systems, Inc., San Jose, CA (US)

(72) Inventors: Claudia Ursula Roesch, Menningen (DE); Arnold Jean Marie Gustave Ginetti, Antibes (FR); Robert Makofske, Melbourne, FL (US); Vishal Agarwal, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 896 days.

(21) Appl. No.: 18/081,796

(22) Filed: Dec. 15, 2022

(51) Int. Cl.
*G06F 30/398* (2020.01)
*G06F 30/323* (2020.01)
*G06F 30/392* (2020.01)

(52) U.S. Cl.
CPC .......... *G06F 30/398* (2020.01); *G06F 30/323* (2020.01); *G06F 30/392* (2020.01)

(58) Field of Classification Search
CPC ..... G06F 30/398; G06F 30/392; G06F 30/323
USPC .......................................................... 716/103
See application file for complete search history.

(56) References Cited

U.S. PATENT DOCUMENTS 5,867,395 A * 2/1999 Watkins .................. G06F 30/30 716/106
7,024,345 B1 * 4/2006 Stamm .................... G06F 30/33 714/739
10,274,533 B1 * 4/2019 Visvardis ............... G01R 31/26
10,372,946 B1 * 8/2019 See ......................... G06F 21/53
10,878,150 B1 * 12/2020 Savarbaghi ........... G06F 30/343
11,790,147 B1 * 10/2023 Liu ....................... G06F 30/398 716/100
2004/0243949 A1 * 12/2004 Wang .................... G06F 30/398 716/112
2005/0010598 A1 * 1/2005 Shankar ................. G06Q 10/06
2010/0333051 A1 * 12/2010 Woods .................. G06F 30/367 716/126
2014/0282308 A1 * 9/2014 Chen ..................... G06F 30/398 716/102
2016/0140273 A1 * 5/2016 Alfano .................. G06F 30/367 703/14
2023/0237234 A1 * 7/2023 Chang ..................... G06F 30/39 716/119
2024/0046020 A1 * 2/2024 Yu Tseng ............. G06F 30/394

* cited by examiner

*Primary Examiner* — Suchin Parihar
(74) *Attorney, Agent, or Firm* — Mark H. Whittenberger; Holland & Knight LLP

(57) ABSTRACT

Embodiments include herein are directed towards a method for physical verification of an electronic design. Embodiments may include causing, using a processor, a generation of a layout at a graphical user interface and receiving a user input corresponding to a device at the graphical user interface. Embodiments may further include automatically generating one or more shapes based upon, at least in part, a technology independent input file.

17 Claims, 12 Drawing Sheets

```
trp_version 2
#!force_model_overwrite
#
#
model: Ind1_demo
device: Ind1_demo
drl: DEVICE_New_TestLib_Ind1_demo_layout
dfiiCell: lib=New_TestLib cell=Ind1_demo view=layout
pinMap:  P1=P1 P2=P2
#
#
model: Ind2_demo
device: Ind2_demo
drl: DEVICE_New_TestLib_Ind2_demo_layout
dfiiCell: lib=New_TestLib cell=Ind2_demo view=layout
pinMap:  P1=P1 P2=P2
#
#
model: Ind3_demo
device: Ind3_demo
drl: DEVICE_New_TestLib_Ind3_demo_layout
dfiiCell: lib=New_TestLib cell=Ind3_demo view=layout
pinMap:  P1=P1 P2=P2 P3=P3
#
model: mlres
dfiiCell: lib=gpdk180 cell=mlres view=ivpcell
pinMap:  PLUS=PLUS MINUS=MINUS
pmExclude: r=R w=W l=L m="1"  segments="1"
#
```

FIG. 8

SYSTEM AND METHOD FOR ADDRESSING CUSTOM PASSIVE DEVICES ASSOCIATED WITH THE PHYSICAL VERIFICATION OF AN ELECTRONIC CIRCUIT DESIGN

BACKGROUND

Various technologies exist for designing and verifying an electronic design, such as the design of an integrated circuit (IC). Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product. The exploding demand for high performance electronic products has increased interest in efficient and accurate simulation techniques for integrated circuits. For analog designs, an analog-based simulation approach such as SPICE or SPICE-like simulations (e.g., FastSPICE, HSPICE, PSPICE, or any other SPICE-based or SPICE-compatible simulations) are commonly used to implement simulation of the design. For a digital circuit, equivalent digital simulation is performed.

Radio-frequency integrated circuit (RFIC) designers need optimized custom passive devices. The layout for these devices are manually created and not part of the foundry process design kit (PDK). RF-circuits that contain such custom passive devices need to pass all physical sign-off flows. Physical sign-off flows are, for example, design rule checks (DRC), layout-versus-schematic (LVS) checks, dummy metal-fill insertion, and others. In addition, parasitic extraction (PEX) and post-layout simulation flows must be supported.

SUMMARY

In one or more embodiments of the present disclosure, a computer-implemented method for physical verification of an electronic design. Embodiments may include causing, using a processor, a generation of a layout at a graphical user interface and receiving a user input corresponding to a device at the graphical user interface. Embodiments may further include automatically generating one or more shapes based upon, at least in part, a technology independent input file.

One or more of the following features may be included. In some embodiments, the method may include creating a device signature configured to store the one or more shapes. The one or more shapes may be stored in a binary format. Creating a device signature may include automatically creating a label for unique device recognition. Creating a device signature may include automatically creating add-on extraction rules for a custom passive device. The method may include scanning an electronic design associated with the layout for one or more custom passive devices. The method may further include automatically adding a custom passive sub-circuit definition to an electronic design netlist. The method may further include storing the device signature and the add-on extraction rules as a text file and performing a layout versus schematic comparison including the text file.

In one or more embodiments of the present disclosure a computer-readable storage medium having stored thereon instructions, which when executed by a processor result in one or more operations is provided. Operations may include causing, using a processor, a generation of a layout at a graphical user interface and receiving a user input corresponding to a device at the graphical user interface. Operations may further include generating one or more shapes based upon, at least in part, a technology independent input file. Operations may also include generating a circuit description language (CDL) netlister view and generating a parasitic extraction file based upon, at least in part, the one or more shapes.

One or more of the following features may be included. In some embodiments, the method may include creating a device signature configured to store the one or more shapes. The one or more shapes may be stored in a binary format. Creating a device signature may include creating a label for unique device recognition. Creating a device signature may include creating add-on extraction rules for a custom passive device. The method may include scanning an electronic design associated with the layout for one or more custom passive devices. The method may further include adding a custom passive sub-circuit definition to an electronic design netlist. The method may further include storing the device signature and the add-on extraction rules as a text file and performing a layout versus schematic comparison including the text file.

In yet another embodiment of the present disclosure a system for physical verification of an electronic design is provided. The system may include a processor configured to cause a generation of a layout at a graphical user interface. The processor may be configured to receive a user input corresponding to a device at the graphical user interface and to automatically generate one or more shapes based upon, at least in part, a technology independent input file.

One or more of the following features may be included. In some embodiments, the processor may be configured to create a device signature configured to store the one or more shapes. The one or more shapes may be stored in a binary format. Creating a device signature may include automatically creating a label for unique device recognition.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 4-11 illustrate examples of graphical user interfaces consistent with embodiments of the present disclosure.

DETAILED DESCRIPTION

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-12.

Figure 1:
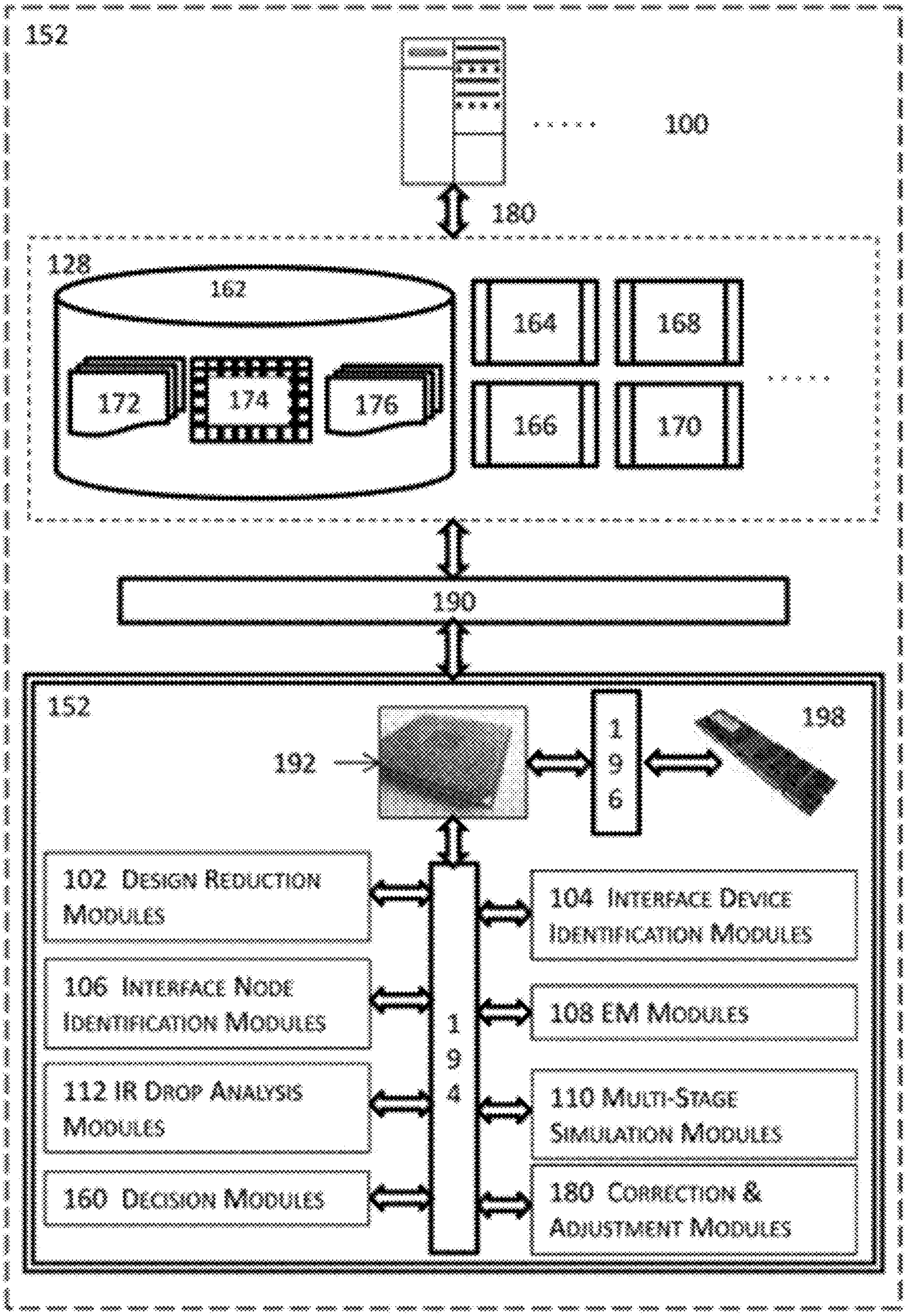
FIG. 1 illustrates a high level block diagram of a hardware system for implementing an electronic design using a dual-mode modeling process in one or more embodiments.

FIG. 1 illustrates a high level block diagram of a system for addressing custom passive devices associated with the physical verification of an electronic circuit design in one or more embodiments. In these embodiments, FIG. 1 illustrates a high level block diagram of a hardware system and may comprise one or more computing systems 100, such as one or more general purpose computers described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases 174 such as schematic design database(s) or physical design database(s), electronic circuit design specification database(s), various statistics, various data, rule decks, various design rules, constraints, etc. 172, or other information or data 176 that may be used to facilitate the performance of various functions to achieve the intended purposes.

In some embodiments, the one or more computing systems 100 may include or, either directly or indirectly through the various resources 128, invoke a set of mechanisms or modules 152 including hardware and software modules or combinations of one or more hardware and one or more software modules that are stored at least partially in computer memory may comprises one or more design reduction modules 102 to reduce a representation of an electronic design (e.g., an RLC network) into a reduced representation such as an RC reduced (or RCR) network, a capacitance only (C-only) network, etc. of the electronic design. The set of modules 152 may further include one or more interface device identification modules 104 to identify interface devices (or tap devices such as current taps).

The set of modules 152 may further optionally include one or more interface or tap node identification modules 106 to identify interface or tap nodes that interconnect one or more interface devices to an electronic design. In addition or in the alternative, the set of modules 152 may further include one or more electro-migration (EM) modules 108 to perform various electro-migration analyses with respect to various EM-related constraints. In some embodiments, the set of modules 152 may further include one or more multi-stage simulation modules 110 to perform multi-stage simulations or analyses on an electronic design of interest with different representations of the underlying electronic design to achieve fast and accurate simulation and/or analysis results.

In addition or in the alternative, the set of modules 152 may comprise one or more decision modules 160 to determine, for example, whether corrections or adjustments to electrical characteristics (e.g., voltages) are to be applied to multi-stage simulations or analyses. The set of modules 152 may also include one or more correction and adjustment modules 180 to identify or determine required or desired corrections or adjustments to one or more electrical characteristics of an electronic design of interest and to apply the required or desired corrections or adjustments to these one or more electrical characteristics of the electronic design of interest.

The set of modules 152 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 100 may include the various resources 128 such that these various resources may be invoked from within the computing system via a computer bus 196 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 196 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
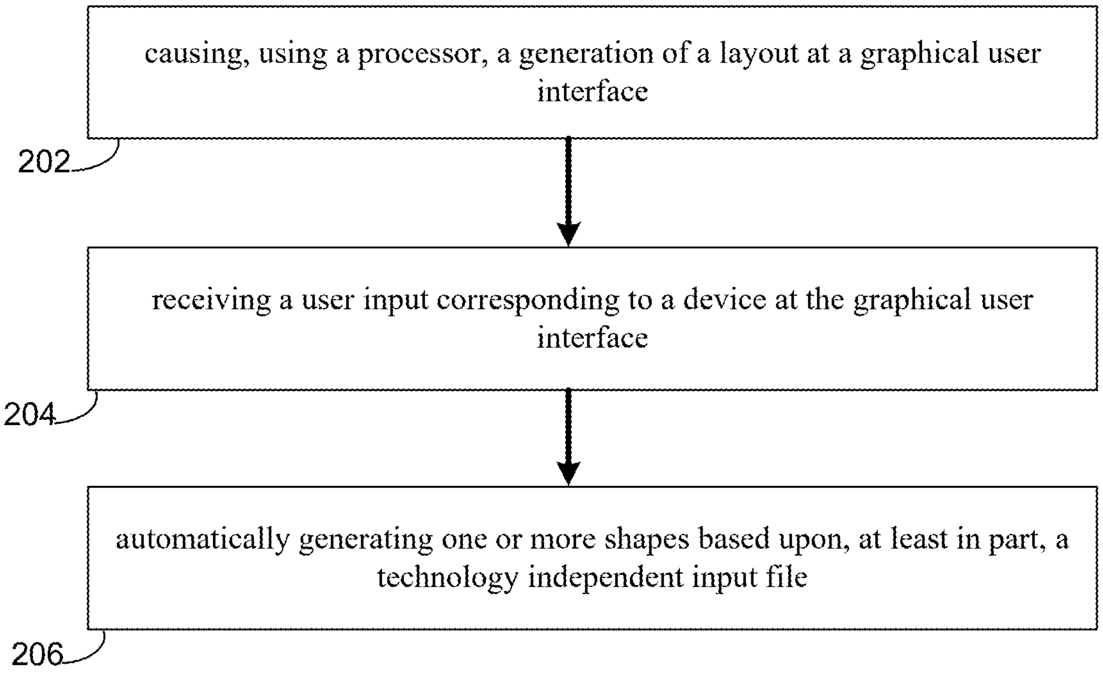
FIGS. 2-3 illustrate flowcharts depicting operations consistent with embodiments of a verification process consistent with embodiments of the present disclosure.

FIG. 2 illustrates a high-level flowchart that includes one or more operations that may be employed for physical verification of an electronic design is provided. The method may include causing (202), using a processor, a generation of a layout at a graphical user interface and receiving (204) a user input corresponding to a device at the graphical user interface. Embodiments may further include automatically generating (206) one or more shapes based upon, at least in part, a technology independent input file. Numerous other operations are also within the scope of the present disclosure.

The phrase "custom device" as used herein may refer to a device which is not part of the process technology (PDK). The phrase "device signature" may refer to a layer and pattern for all device shapes, which may be stored in binary format. Semiconductor foundries provide process design kits (PDKs) to be used for circuit design, simulation and physical verification. PDKs ensure that IC designs are manufacturable and that circuit simulations accurately predict electrical characteristics of the final product. They include, for example, simulation models for each device, layer definitions for all fabrication steps, rules for physical verification, and more. All parts of a PDK target a specific manufacturing process and can be used only in context with this specific foundry technology. In general, LVS rule decks included in a PDK use dedicated layers to recognize metal devices. In the layout the designer may draw a marker shape in this layer to ensure that the device is correctly identified. The layer name many vary from one foundry PDK to the next. And as such the marker shapes are technology specific. Input files which do not include information specific to a particular PDK are technology independent. The term "shapes", as used herein, may refer to marker shapes, metal shapes, and via shapes.

Referring now to FIGS. 3-12, embodiments showing examples for addressing custom passive devices associated with the physical verification of an electronic circuit design are provided. As discussed above, RFIC designers need optimized custom passive devices. The layout for these devices is manually created and not part of the foundry PDK (e.g., RF designers characterize the device and create a symbol and S-parameter view, e.g., the symbol may be placed in the schematic and the S-parameter view may be selected for circuit simulation). RF-circuits that contain such custom passive devices need to pass all physical sign-off flows. Physical sign-off flows are, for example, DRC, LVS checks, dummy metal-fill insertion, and others. In addition, PEX and post-layout simulation flows must be supported.

All of these flows may require certain marker shapes. PDK devices provided by the foundry have relevant marker shapes. In prior systems, for custom passive devices, these marker shapes need to be manually added based on the foundry-provided DRC and LVS rules. To address this issue and others, embodiments included herein describe an approach to automatically create any number of technology dependent marker shapes based on a recipe stored in an ASCII text file.

Foundry-provided LVS extraction rules contain an extraction statement for every PDK device. However, custom passive devices are not extracted by these rules files. Therefore, the custom passive device cannot be checked by LVS. Prior approaches use a black-box LVS flow to address limitations for custom passive devices. The black-box flow has several drawbacks and entails verification gaps.

Figure 3:
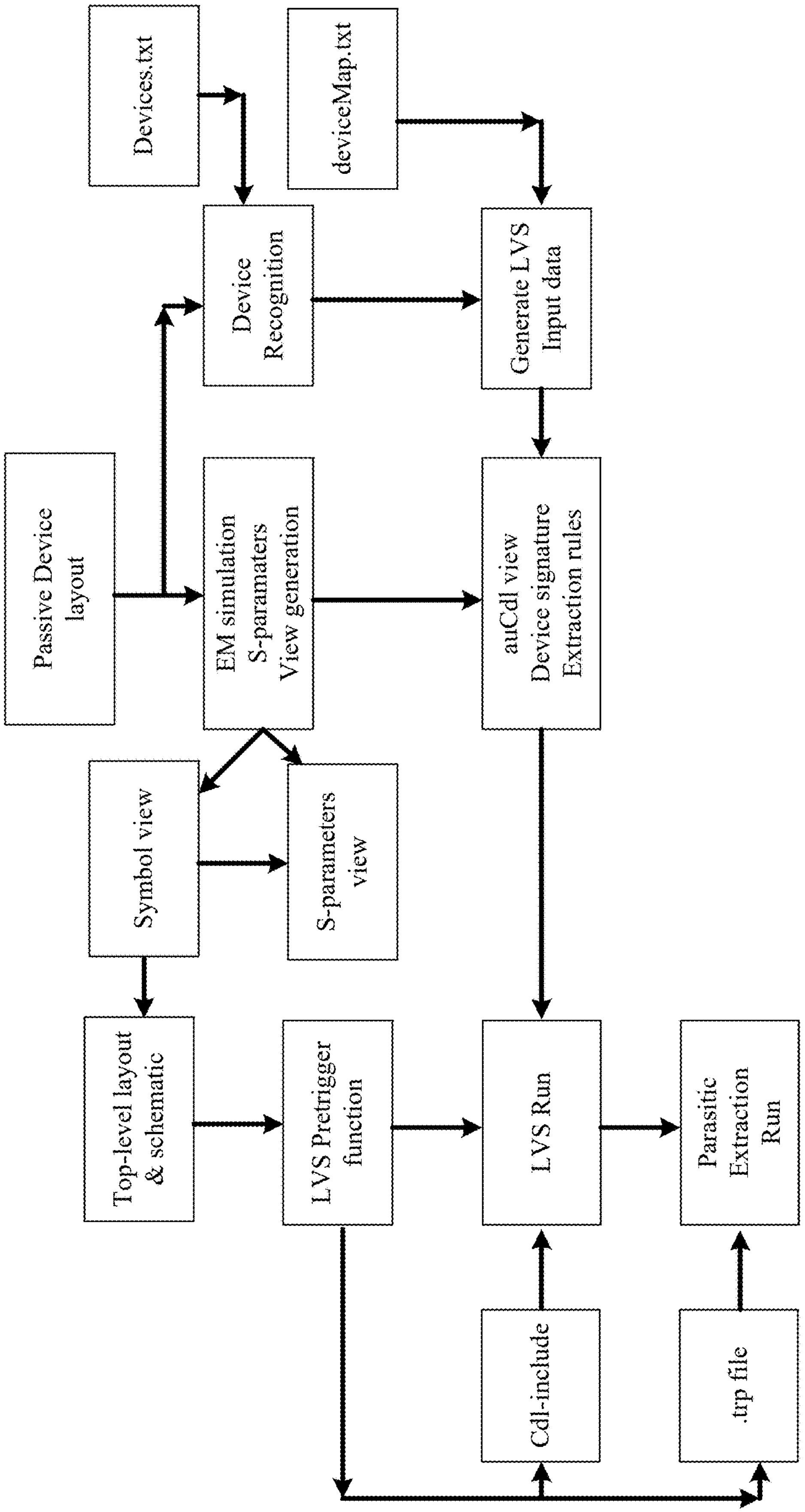

To address this issues and others, and referring also to FIG. 3, a flowchart consistent with embodiments of the present disclosure is provided. Embodiments included herein describe an alternative approach to handle custom passive devices in top-level LVS. Automatically generated technology dependent marker shapes may be used to recognize the custom passive device and to define its boundary. Embodiments included herein provide for device signature generation and an automatically generated add-on LVS extraction file may be generated to extract, netlist and verify a custom passive device. This approach overcomes the drawbacks of a black-box LVS flow and closes existing verification gaps. Parasitic extraction is based on LVS. The present disclosure provides a mechanism to handle custom passives that are characterized with a device signature for parasitic extraction.

In existing systems, marker shapes for custom passive devices need to be manually added. The size and layer of these shapes need to be extracted from foundry-provided rules files, which is a time-consuming approach.

In existing LVS verification flows custom passive devices are treated as a black-box. In a black-box LVS flow only the connections to device pins are extracted. The device itself is extracted as an empty sub-circuit (e.g., black-box). With this approach it is possible to verify whether the device is correctly connected in the layout. Whether or not the device itself is correct cannot be verified. Routing that is either touching or crossing the device on a higher level of the layout hierarchy is strongly impacting the electrical characteristics of the device, which cannot be checked with black-box LVS.

One existing approach for handling custom passive devices in LVS is to manually create a "new device", which involves manually creating all data that is required to support all EDA flows. It includes the component description format (CDF) setup, manual modifications of the LVS rules files, and more. This approach is labor-intensive and not scalable. In addition, many customers have liability concerns and refuse to modify LVS decks provided by the foundry.

In some embodiments, and as shown in FIG. 3, the process for creating custom passive devices begins with a user accessing an electronic design layout. In operation, an RF-designer may draw the device/layout shapes and create pins with labels at a graphical user interface. In this example, the passive device layout refers to a manually created layout of the custom passive device. The "EM simulation; S-param view generation" may include running an electro-magnetic solver to extract one or more s-parameters and create an s-parameter view. The s-parameter view may be used to view a device model for circuit simulation. The symbol view may be used to view the top-level schematic. The device recognition function may be used to read one or more technology specific recipe files (e.g., devices.txt) and automatically add one or more marker shapes to the passive device layout. The generate LVS input data function may be used to read one or more technology specific input files (e.g., deviceMap.txt) to automatically create data required for top-level LVS.

In some embodiments, the "auCdl view; device signature; extraction rules" module may receive the generated LVS data and the auCdl view may be used by the cdl-netlister to correctly netlist the new custom device. The device signature may be used by the LVS device extraction engine to recognize the device. Extraction rules may be required by the LVS tool to uniquely identify the device. The top-level layout and schematic module may receive a symbol view, which may be used by the circuit designer, and the passive device layout (including the marker shapes added by the device recognition process) for the top-level schematic and layout respectively. The LVS pre-trigger function may be used to trigger a function call to include additional data generated by the generate LVS input data module in a standard LVS flow. In addition, a text file for LVS (e.g., cdl-include) and a second text file for parasitic extraction (e.g., .trp file) may be generated for the custom passive device. The LVS run may perform a standard LVS flow using additional automatically generated data and may provide an output to the parasitic extraction run that may include a standard parasitic extraction technique using additional automatically generated data.

Figure 4:
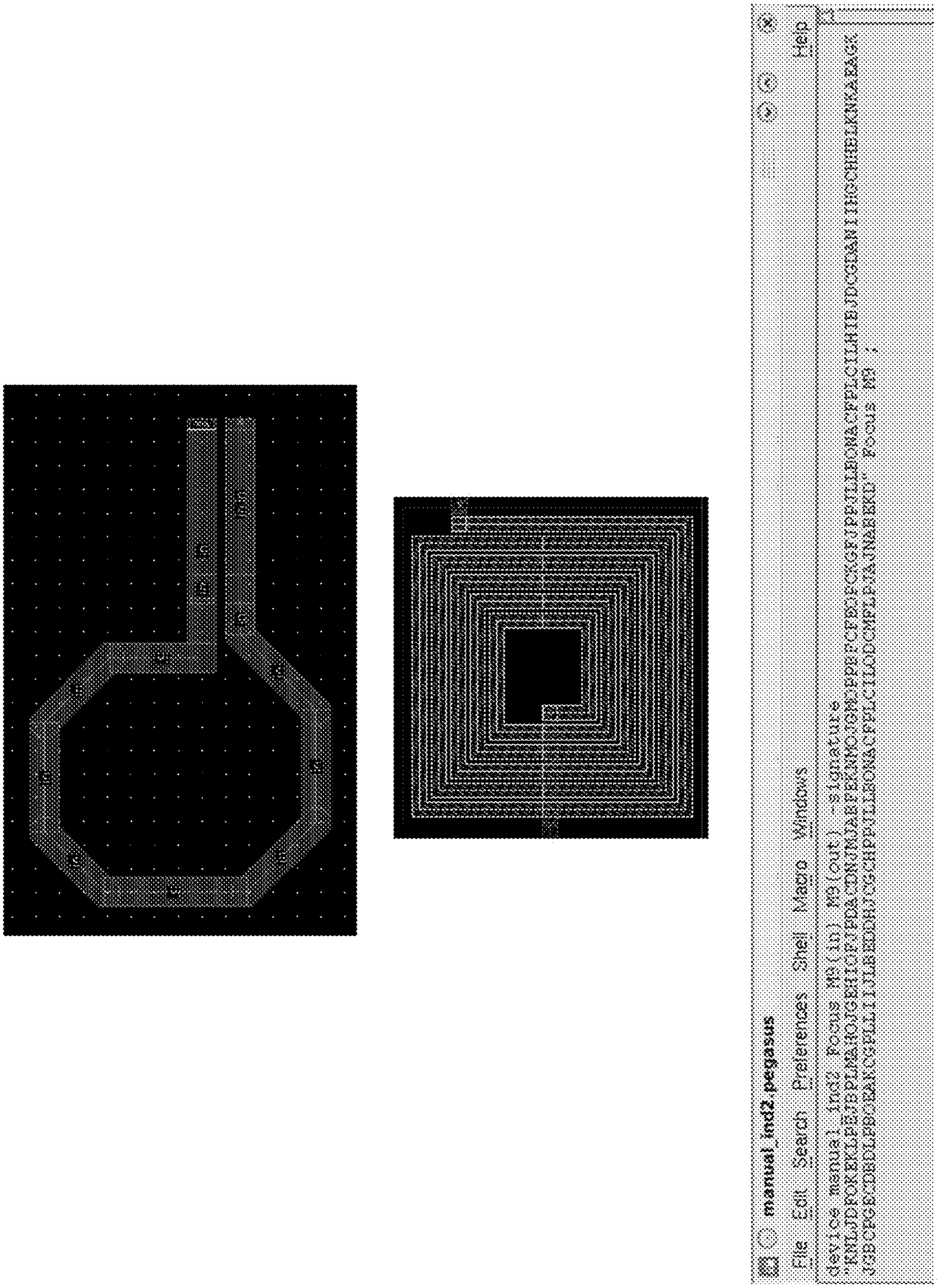

Referring now to FIG. 4, embodiments included herein may be configured to allow the user to automatically create technology dependent marker shapes. The shapes may be used for DRC, LVS, device recognition, etc. For example, in LVS, the shapes may be used to cut out the device metal from an interconnect metal to avoid shorts and double counting of parasitics. The shapes may also be used to define the boundary of the custom passive device.

In some embodiments, the size/boundary of these new shapes may be derived from existing shapes by applying operators like AND (the derived shape is a logic AND of two existing shapes), GROW (the derived shape is created by growing an existing shape by a defined value), and others. Some operators may include, but are not limited to, Find, Grow, And, Not, Or, Xor, Holes, Box, Inside, Outside, Enclose, Straddle, etc. Definitions of each of these are provided below:

[Find]: find a shape on a specific layer and copy it to the specified output layer;

[Grow]: grow an existing shape by a defined value and copy it to the specified layer;

[And]: build the logic AND of two shapes and copy the result to the specified layer;

[Not]: select logic NOT of a shape and copy the result to the specified layer;

[Or]: build the logic OR of two shapes and copy the result to the specified layer;

[Xor]: build the logic XOR of two shapes and copy the result to the specified layer;

[Holes]: select the holes inside a shape and copy the result to the specified layer;

[Box]: select the bounding box of a shape (smallest rectangle that completely encloses the shape) and copy the result to the specified layer;

[Inside]: select all shapes of a specific layer that are completely inside shapes of a second layer and copy the result to the output layer;

[Outside]: select all shapes of a specific layer that are completely outside shapes of a second layer and copy the result to the output layer;

[Enclose]: select all shapes of a specific layer that enclose shapes of a second layer and copy the results to the output layer; and

[Straddle]: select all shapes of a specific layer that straddle shapes on a second layer and copy the results to the output layer.

In some embodiments, a device signature generator may create a device signature. This may store the shapes of the device in a binary format. A graphical user interface depicting an example device signature is shown in FIG. 4. The top two graphical user interfaces show examples of custom passive devices. The first is a simple, manually drawn inductor and the second shows a parametrized cell (PCell) where layout parameters like the metal width of inductor windings or the number of turns may be user-definable. In both examples, the specific device is not part of the foundry PDK. The bottom display shows a graphical user interface including an exemplary device signature. It contains a keyword for device extraction (device), the model name (manual_ind2), the recognition layer (Focus), the device terminals (terminal "in" on layer "M9" and terminal "out" on layer "M9"), a keyword (signature), a string that encodes all shapes comprising the device, the device boundary layer (Focus) and a list of device layers (here only M9).

Figure 5:
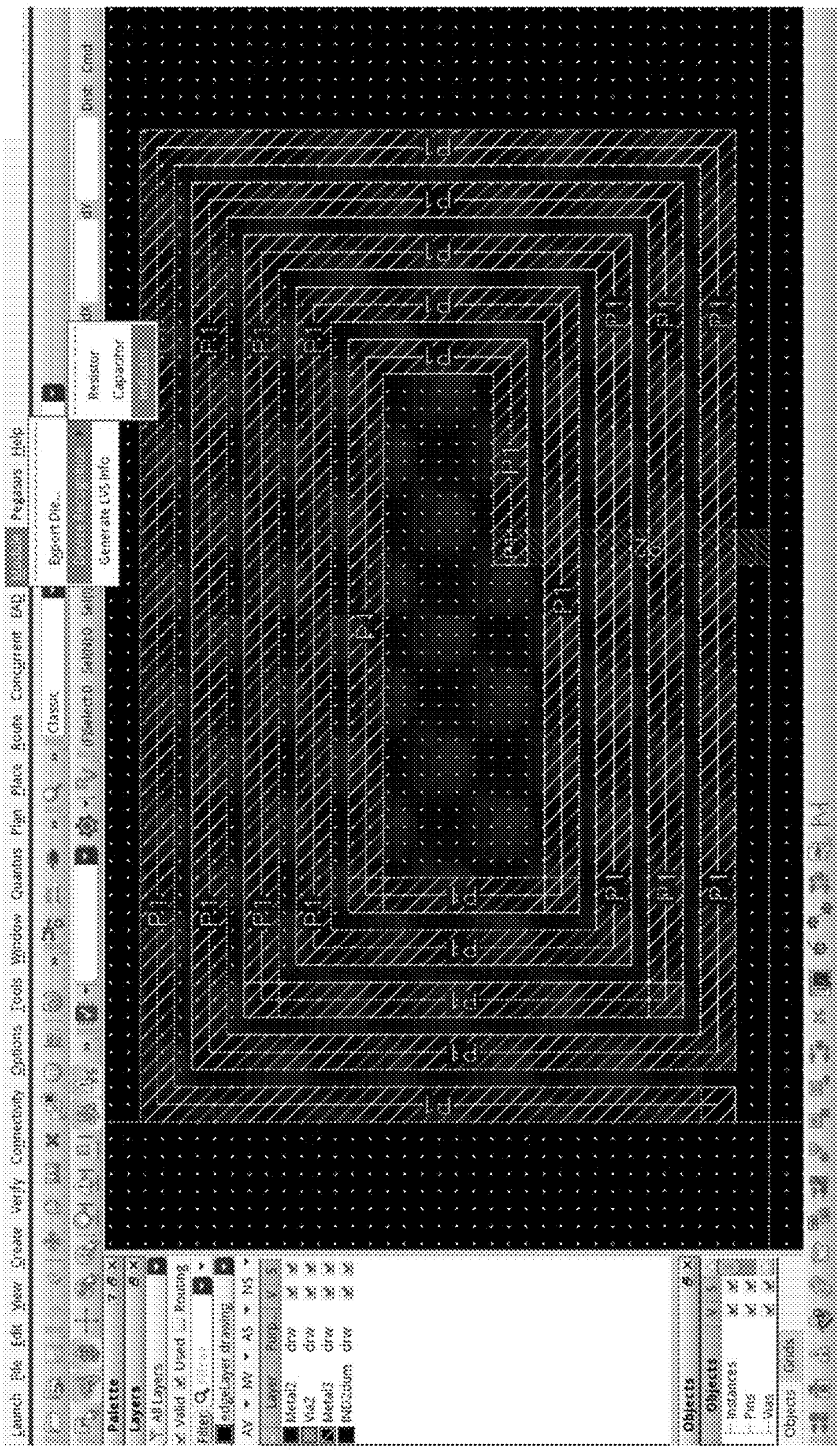

In some embodiments, and referring now to FIG. 5, the present disclosure may be used to create technology specific marker shapes. A graphical user interface may be used to create derived shapes based on an input file (e.g. ASCII). This approach may be used to create shapes on layers that are used in DRC and LVS rule files to impact physical verification and post processing (e.g. DRC rule checking, dummy fill generation, definition of interconnect in LVS, etc.). Embodiments included herein may also be used to create a device recognition shape on a unique device recognition layer for signature generation and top-level LVS.

In some embodiments, the input file (e.g., ASCII) may be used to define the layer derivation rules and the layer-purpose pair (LPP) of the output shapes. These output shapes may be created in the layout of the custom passive device as they are required for physical sign-off flows.

An example ASCII input file to define layer derivation rule is provided below.

File format:

```
Devices (<
  deviceName> ((<
    derivedLayer> (<operator> <arg1> [<arg2>]) [<out-
      putLayer> <outputPurpose>])
    . . .
  )
  . . .
)
```

EXAMPLE file:

```
Devices(
  Inductor(
    ( LayM10 (Find M10 drawing ) nil )
    ( PinM10 (Find M10 pin ) nil )
    ( GrowPin (Grow PinM10 0.002 ) nil )
    ( DevMark (Find IND drawing ) IND Mark drawing )
    ( M10_wo_Pin (Not LayM10 GrowPin ) nil )
    ( IndDev (Or M10_wo_Pin DevMark ) nil )
    ( TmpLay (Grow M10_wo_Pin 5 ) nil )
    ( DevLay (And IndDev TmpLay ) IND_Dev drawing )
    ( RefLay (And TmpLay DevMark ) IND_Ref drawing )
  )
)
```

Figure 6:
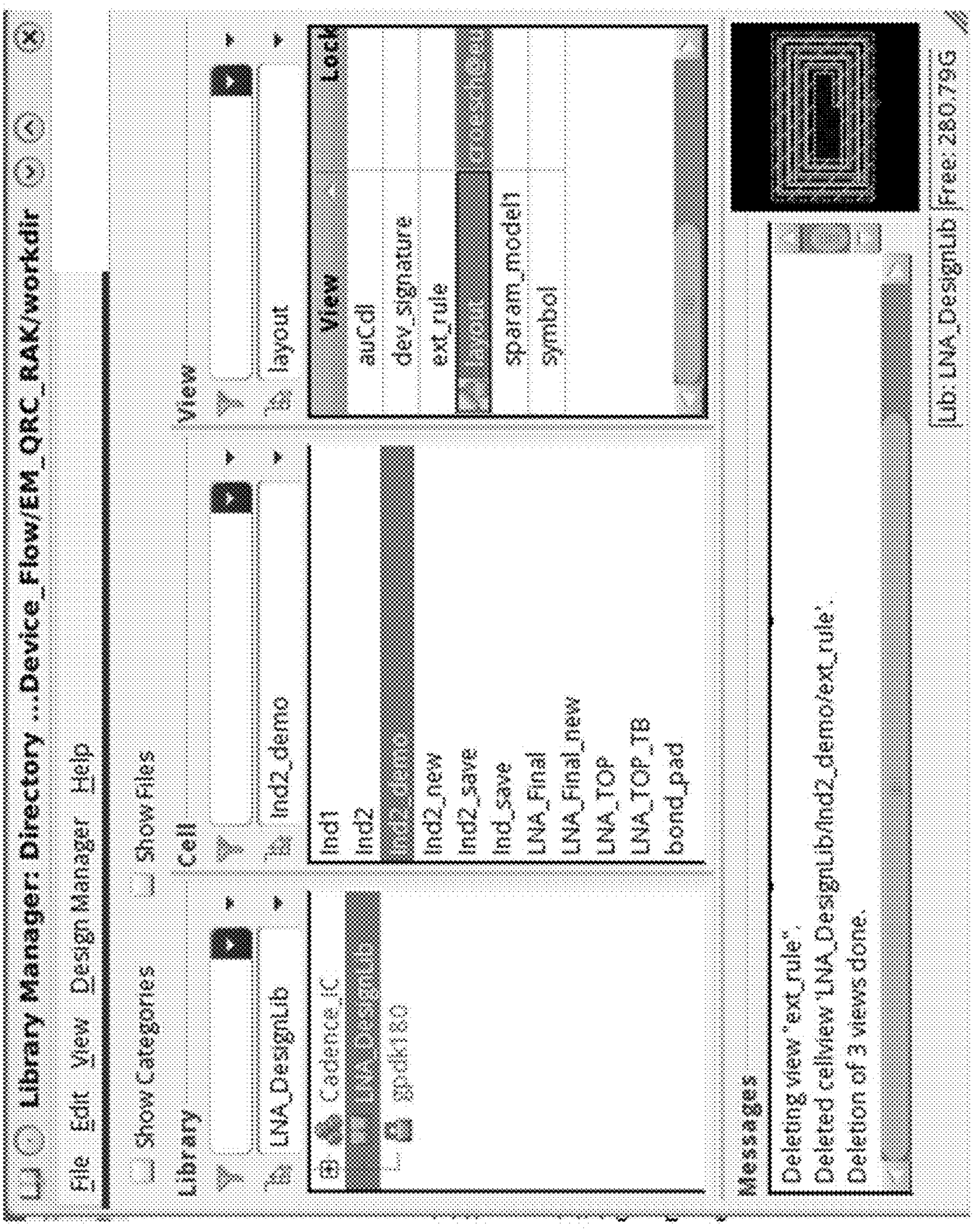

In some embodiments, and referring now to FIG. 6, the present disclosure may be used to automatically generate LVS input data. FIG. 6 depicts an example graphical user interface that may be used with embodiments of the present disclosure. The interface in FIG. 6 displays the data in a 5× data structure. The CDL netlist is generated when clicking "Generate LVS Info" menu item in FIG. 5. In the 5× data structure the design project may be structured in a design library (e.g., LNA_DesignLib) that contains a list of cells (e.g., Ind1, Ind2, . . . ). Each cell may include several representations (i.e., views). Hierarchical cells usually have a layout, a schematic and a symbol view. Leaf cells (i.e. functional units at the lowest level of hierarchy) may include layout and symbol view but no schematic view. In addition, additional cell-specific information like the simulation model (e.g., sparam_model) or the stopping view for the cdl-netlister (e.g., auCdl) may be stored as a separate view in the 5× data structure. The device signature and the add-on extraction rules may be specific to a certain cell and stored as a separate "view" to this cell.

Figure 7:
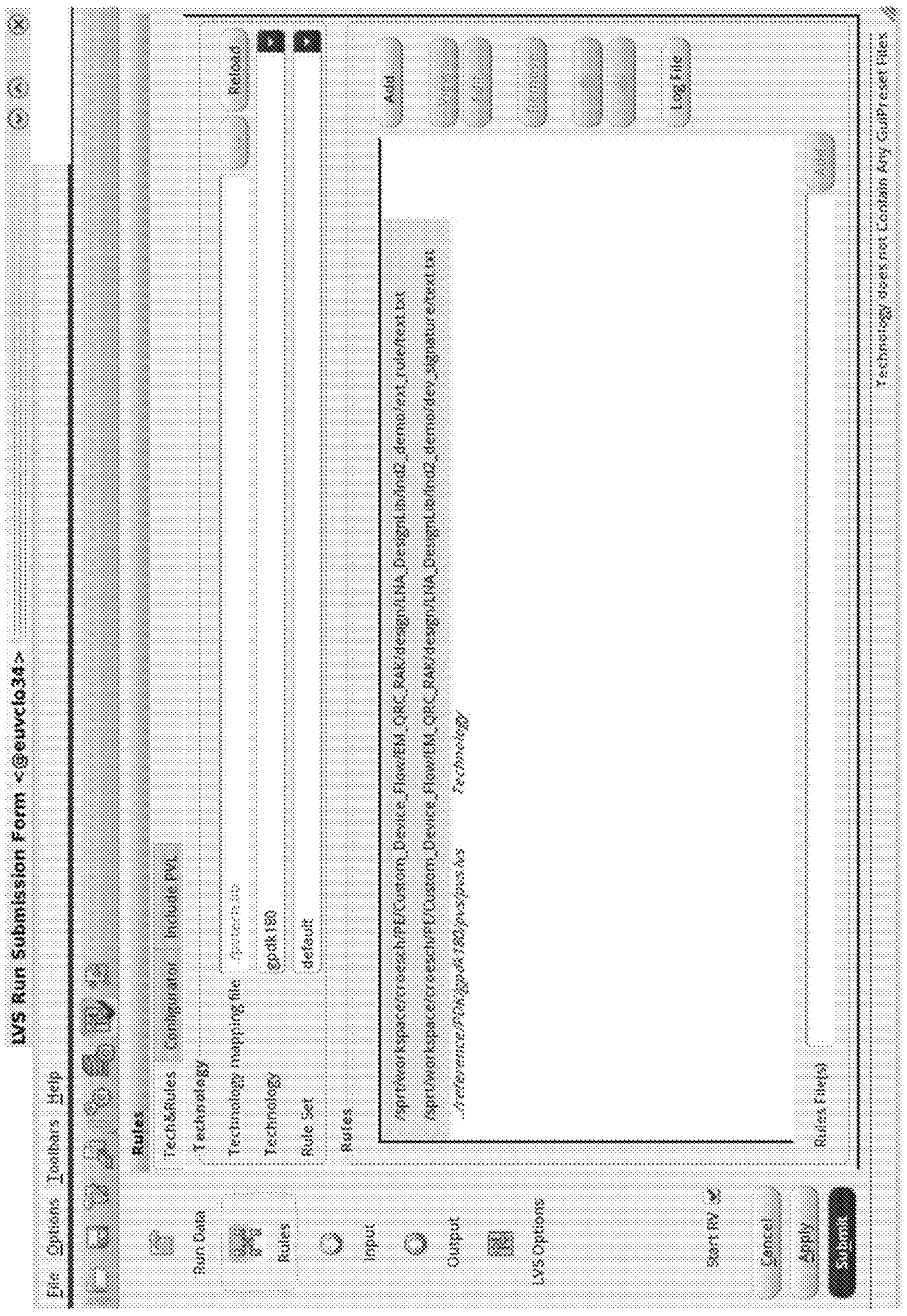

In some embodiments, and referring now to FIG. 7, the present disclosure may include a pre-trigger function that may be used in accordance with the top-level LVS. In operation, the pre-trigger function may be configured to scan the design for custom passive devices (i.e., device signature is available) and to automatically add a custom passive sub-circuit definition in CDL netlist. The pre-trigger function may then automatically add the custom passive device to <run_name>.trp file for the generation of a netlist-able layout view. The pre-trigger function may automatically include a device signature and add-on LVS extraction rules stored as a text file in the 5×-data structure of the custom passive device to the LVS run deck. Embodiments included herein may support any number of custom passive devices. LVS verification may then be run including some or all of this information.

In some embodiments, the present disclosure may allow the RF-designer to (among other marker shapes) create a device recognition shape and a device boundary shape for his custom passive device. These shapes are used by an electronic design tool (e.g., LVS) to generate a device signature. Flow automation also generates a unique label on top of the device recognition shape and an add-on LVS extraction rule file. This approach allows RF-design teams to define any number of custom passive devices and correctly verify them during LVS without generating a conflict. An example of an automatically generated label for unique device recognition may take the following format: <libName>_<cellName>_<viewName>. Examples for a device signature and the add-on LVS rules are provided below:

Device Signature:

```
DEVICE Ind2_demo
  DEVICE_LNA_DesignLib_Ind2_demo_layout
  M2Term (P2)
M3Term (P1) M4Term (P3)-signature
"LJGEEICFKGJJHMCICHPBFEOCPNIEBAK-
  PBJHOPCGCNMHIDOCMLADJLKFN OGBKDCO-
  BOFLPLPIPELEKDBJCJKEL-
  KIKCEMAEJLCLBFKABLHDMEHKFFJB
  KGCBBDBILIJEJPMMDAMO-
  AOAADNPFEGJGHPBNCDMMAO-
  BOMENDBGGDG MFBOCHKFMEK"
  DEVICE_LNA_DesignLib_Ind2_demo_layout
  Metal1 Metal2 Metal3 Metal4
```

Add-on LVS Extraction Rules:

```
LAYER DEF Dev_Recognition 4000;
LAYER MAP 231-DATATYPE 0 4000;
LAYER DEF Dev Marker 4010;
LAYER MAP 231-DATATYPE 0 4010;
LAYER DEF DEVTEXT 4020;
LAYER MAP 231-TEXTTYPE 0 4020;
TEXT LAYER DEVTEXT;
select-label-textname
  LNA_DesignLib_Ind2_demo_layout-textlayer DEV-
  TEXT Dev Marker
  LNA_DesignLib_Ind2_demo_layout_dev;
select-interact Dev_Recognition
  LNA_DesignLib_Ind2_demo_layout_dev
  LNA_DesignLib_Ind2_demo_layout_tmp;
or LNA_DesignLib_Ind2_demo_layout_tmp
  LNA_DesignLib_Ind2_demo_layout_dev
  DEVICE_LNA_DesignLib_Ind2_demo_layout;
```

In some embodiments, the device signature and add-on rules are specific for a certain device and may be efficiently stored in the 5× data structure of the device cell.

After the custom passive device is characterized (e.g., a device signature was generated) it may be used in a design as any other PDK device. For top-level LVS the device signature and the add-on extraction rules may be added to the LVS rules files. A pre-trigger function for the LVS run submission form enables automatic population of the form with the device signature and add-on rules for every custom passive device type. The user is able to run top-level LVS without further manual interaction.

The present disclosure allows for the connections of the custom passive device and the device itself to be sufficiently verified during LVS. If metal shapes are touching or overlapping the device boundary this may be flagged during LVS as a "malformed device". If different custom passive devices are used in the layout and schematic this may also be flagged as a "malformed device". Top-level LVS for custom passives verifies that all the device shapes found in the top-level layout exactly match the shapes stored in the device signature. This approach closes the verification gaps in conventional black-box LVS flows and largely reduces the risk of product failure.

Figure 9:
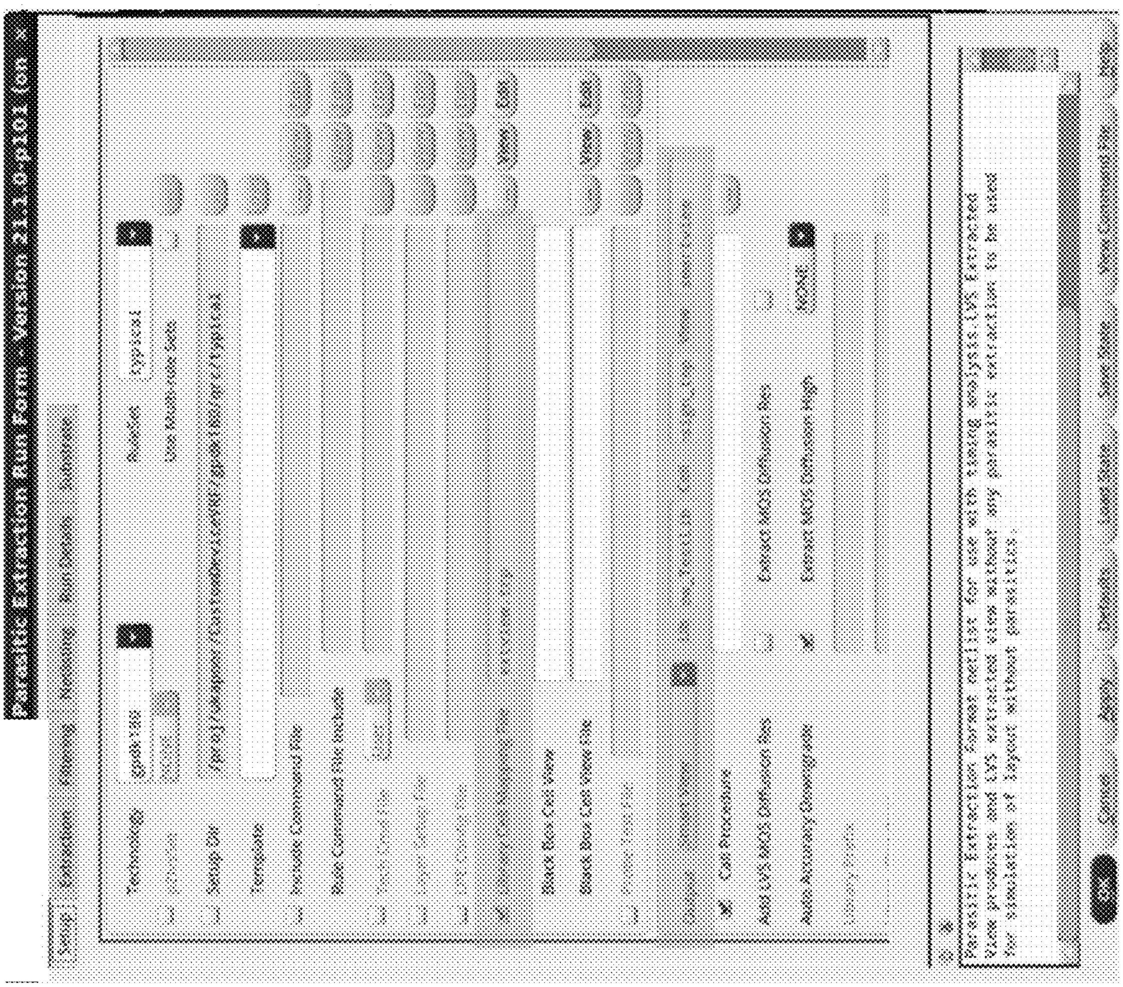

Parasitic extraction flows use the output database of LVS. To support the parasitic extraction flow associated with an electronic design graphical user interface the new custom passive device may be added to a required input file as shown in FIGS. 8-9. This example shows the addition of custom passive devices to a device model definition file (e.g., extview.trp file). The process may use the new extview.trp file in a parasitic extraction run to generate a netlist-able layout view.

Figure 10:
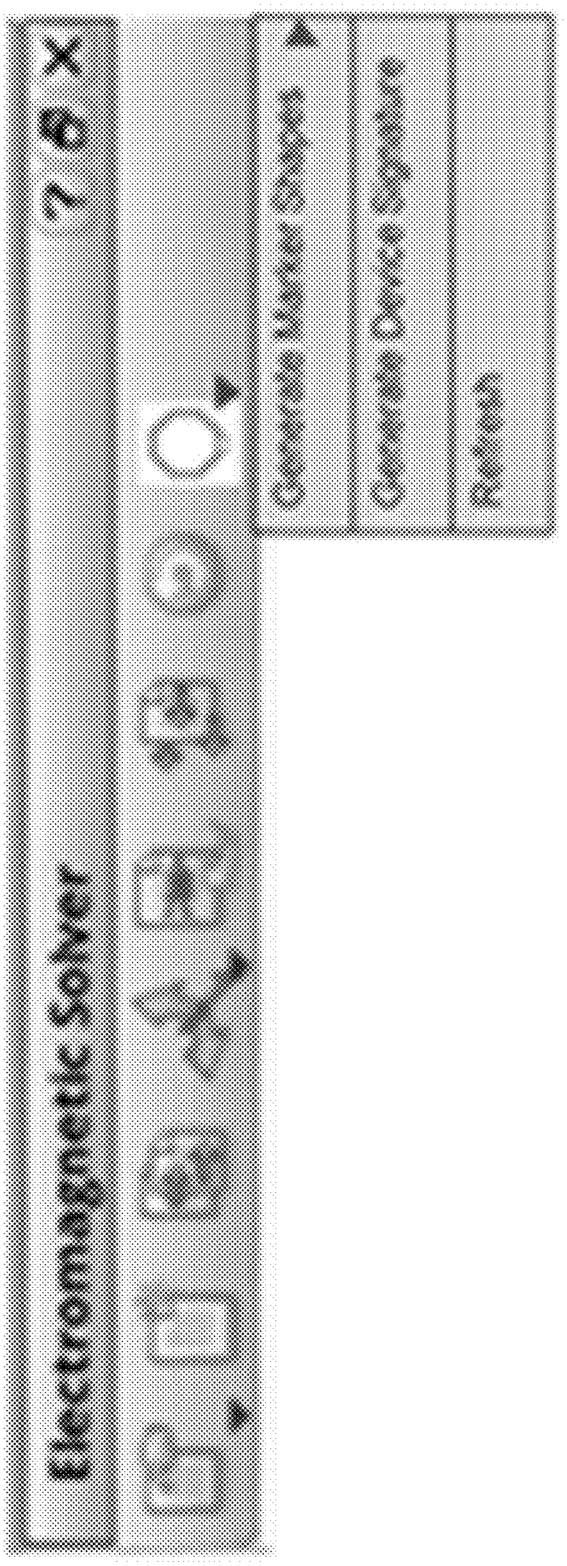
Figure 11:
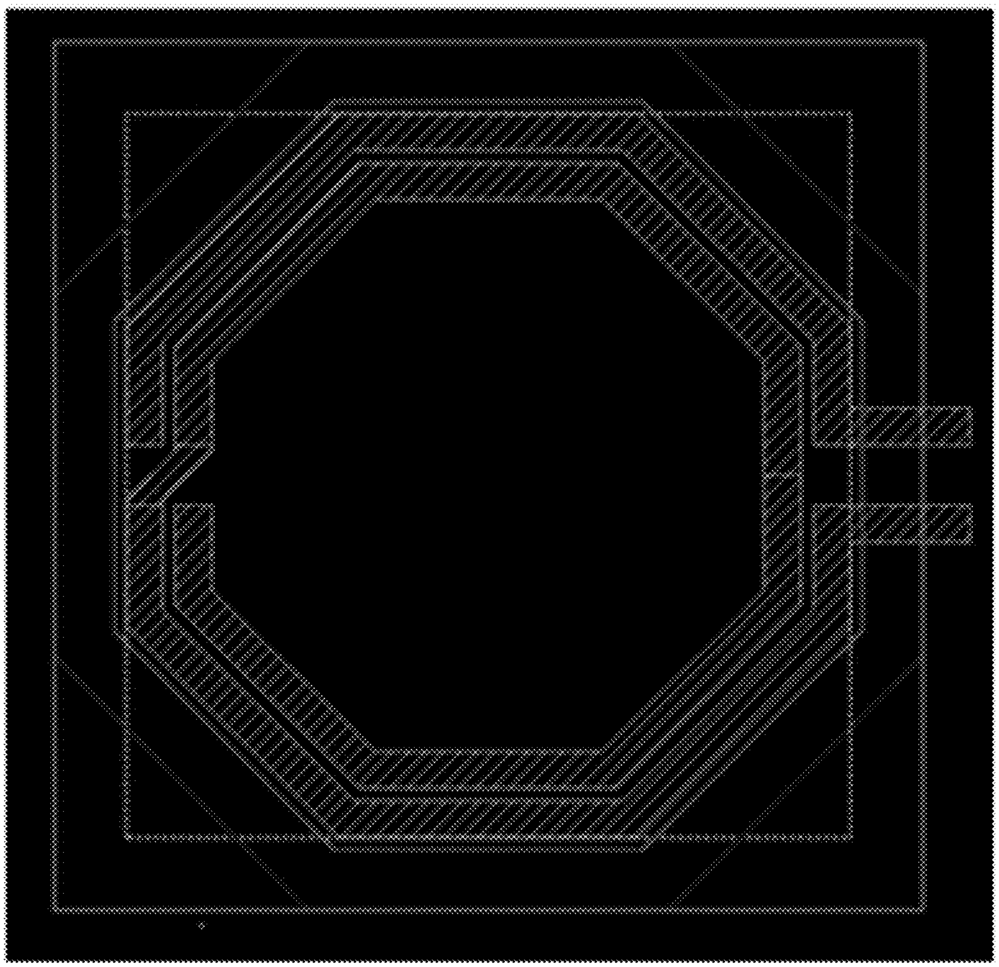

Referring now to FIGS. 10-11, graphical user interfaces consistent with embodiments of the present disclosure are provided. FIG. 10 shows an example graphical user interface depicting selectable options for generating marker shapes, generating device signatures, and a variety of other options. FIG. 11 shows an example graphical user interface depicting an image for an inductor with marker shapes. An example showing the deviceMap.txt is provided below.

```
DeviceLayerMap(
markerLayer(
   ANALOG               drawing        68     0
)
recognitionLayer(
   ANALOG               drawing        68     0
)
pin0ALayerToLVSLayer(
   (Poly                POLYterm)
   (Metal1              metal1_conn)
   (Metal2              metal2_conn)
   (Metal3              metal3_conn)
   (Metal10      metal10_conn)
   (Metal11      metal11_conn)
)
deviceContextLayers(
   (Default      Metal1 Metal2 Metal3 Metal4 Metal10 Metal11)
   (Ind2_new     Metal2 Metal3 Vis2)
   (Ind1_demo           Metal1 Metal3 Vis2)
)
layerNumberMap(
     (recognition    4000)
     (marker         4010)
     (text           4020)
)
)
```

Figure 12:
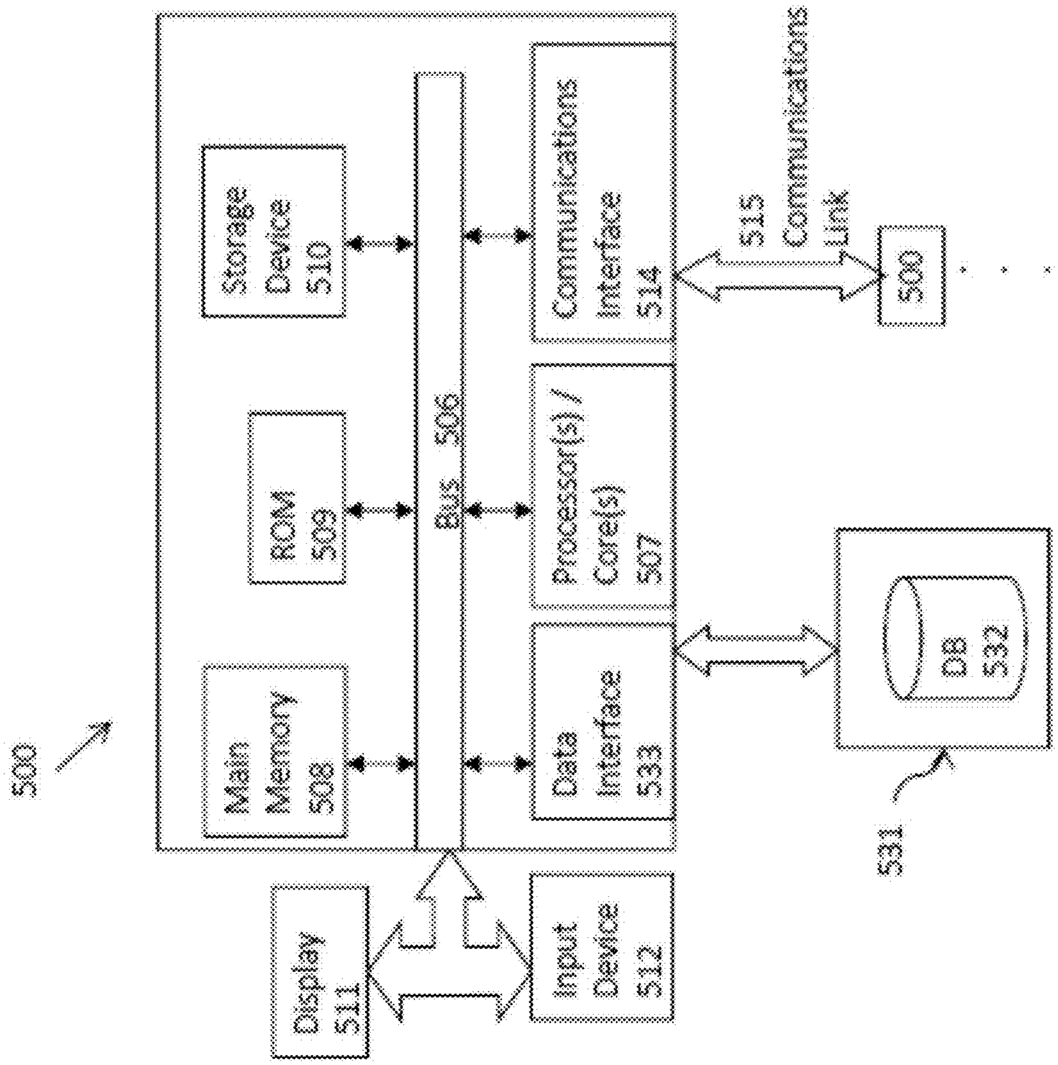
FIG. 12 illustrates a system diagram that may be used to implement one or more embodiments.

FIG. 12 illustrates a block diagram of an illustrative computing system 500 suitable for addressing custom passive devices as described in the preceding paragraphs with reference to various figures. Computer system 500 includes a bus 506 or other communication mechanism for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computing system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A mechanism described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, e.g., application code, through communication link 515 and communication interface 514. Received program code may be executed by processor 507 as it is received, and/or stored in disk drive 510, or other non-volatile storage for later execution. In an embodiment, the computing system 500 operates in conjunction with a data storage system 531, e.g., a data storage system 531 that includes a database 532 that is readily accessible by the computing system 500. The computing system 500 communicates with the data storage system 531 through a data interface 533. A data interface 533, which is coupled with the bus 506, transmits and receives electrical, electromagnetic or optical signals that include data streams representing various types of signal information, e.g., instructions, messages and data. In embodiments of the invention, the functions of the data interface 533 may be performed by the communication interface 514. It also should be appreciated that the computer system 500 may be extended to a cloud-based computing system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for physical verification of an electronic design comprising:

causing, using a processor, a generation of a layout at a graphical user interface;

receiving a user input corresponding to a device at the graphical user interface;

automatically generating one or more shapes based upon, at least in part, a technology independent input file, wherein a technology independent input file is an input file that does not include information specific to a particular process design kit (PDK); and creating a device signature configured to store the one or more shapes.

2. The computer-implemented method for physical verification of an electronic design of claim 1, wherein the one or more shapes are stored in a binary format.

3. The computer-implemented method for physical verification of an electronic design of claim 1, wherein creating a device signature includes automatically creating a label for unique device recognition.

4. The computer-implemented method for physical verification of an electronic design of claim 1, wherein creating a device signature includes automatically creating add-on extraction rules for a custom passive device.

5. The computer-implemented method for physical verification of an electronic design of claim 1, further comprising:

scanning an electronic design associated with the layout for one or more custom passive devices.

6. The computer-implemented method for physical verification of an electronic design claim 5, further comprising:

automatically adding a custom passive sub-circuit definition to an electronic design netlist.

7. The computer-implemented method for physical verification of an electronic design claim 4, further comprising:

storing the device signature and the add-on extraction rules as a text file; and performing a layout versus schematic comparison including the text file.

8. A non-transitory computer-readable storage medium having stored thereon instructions that when executed by a machine result in the following operations:

causing, using a processor, a generation of a layout at a graphical user interface;

receiving a user input corresponding to a device at the graphical user interface;

generating one or more shapes based upon, at least in part, a technology independent input file, wherein a technology independent input file is an input file that does not include information specific to a particular process design kit (PDK);

generating a circuit description language (CDL) netlister view;

generating a parasitic extraction file based upon, at least in part, the one or more shapes; and creating a device signature configured to store the one or more shapes.

9. The non-transitory computer-readable storage medium of claim 8, wherein the one or more shapes are stored in a binary format.

10. The non-transitory computer-readable storage medium of claim 8, wherein creating a device signature includes creating a label for unique device recognition.

11. The non-transitory computer-readable storage medium of claim 8, wherein creating a device signature includes creating add-on extraction rules for a custom passive device.

12. The non-transitory computer-readable storage medium of claim 8, further comprising:

scanning an electronic design associated with the layout for one or more custom passive devices.

13. The non-transitory computer-readable storage medium of claim 12, further comprising:

adding a custom passive sub-circuit definition to an electronic design netlist.

14. The non-transitory computer-readable storage medium of claim 11, further comprising:

storing the device signature and the add-on extraction rules as a text file; and performing a layout versus schematic comparison including the text file.

15. A system for physical verification of an electronic design comprising:

a processor configured to cause a generation of a layout at a graphical user interface, the processor configured to receive a user input corresponding to a device at the graphical user interface and to automatically generate one or more shapes based upon, at least in part, a technology independent input file, wherein a technology independent input file is an input file that does not include information specific to a particular process design kit (PDK); and wherein the processor is configured to create a device signature configured to store the one or more shapes.

16. The system for physical verification of an electronic design of claim 15, wherein the one or more shapes are stored in a binary format.

17. The system for physical verification of an electronic design of claim 15, wherein creating a device signature includes automatically creating a label for unique device recognition.

* * * * *